(12) United States Patent
Koh

(10) Patent No.: US 7,229,894 B2
(45) Date of Patent: Jun. 12, 2007

(54) ACTIVE CELL ISOLATION BODY OF A SEMICONDUCTOR DEVICE AND METHOD FOR FORMING THE SAME

(75) Inventor: Kwan Joo Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 35 days.

(21) Appl. No.: 11/025,011

(22) Filed: Dec. 28, 2004

(65) Prior Publication Data

US 2005/0139952 A1 Jun. 30, 2005

(30) Foreign Application Priority Data

Dec. 30, 2003 (KR) .................... 10-2003-0100712

(51) Int. Cl.
*H01L 21/76* (2006.01)
(52) U.S. Cl. .................. 438/424; 438/421; 438/422; 438/423; 257/E21.546
(58) Field of Classification Search ................ 438/422, 438/423, 426, 411
See application file for complete search history.

(56) References Cited

U.S. PATENT DOCUMENTS 4,925,805 A * 5/1990 van Ommen et al. ........ 438/407
6,245,636 B1 * 6/2001 Maszara ...................... 438/411

OTHER PUBLICATIONS

Wolf et al., "Silicon Processing for the VLSI Era" vol. 1: Process Technology, Lattice Press 1986, pp. 242, 307-308.*

* cited by examiner

*Primary Examiner*—Michael Lebentritt
*Assistant Examiner*—Cheung Lee
(74) *Attorney, Agent, or Firm*—Andrew D. Fortney

(57) ABSTRACT

An active cell isolation body of a semiconductor device and a method for forming the same are disclosed. An example active cell isolation body of a semiconductor device includes a trench with a depth in a semiconductor substrate at an active cell isolation region, a buried gap in the semiconductor substrate at a lower portion of the active cell isolation region, where the buried gap is in communication with the trench and extended toward active regions of the semiconductor substrate, and an active cell isolation film filled in the trench to close the buried gap.

11 Claims, 11 Drawing Sheets

ACTIVE CELL ISOLATION BODY OF A SEMICONDUCTOR DEVICE AND METHOD FOR FORMING THE SAME

RELATED APPLICATION

This application claims the benefit of Korean Application No. P2003-0100712 filed on Dec. 30, 2003, which is hereby incorporated herein by reference in its entirety.

TECHNICAL FIELD

The present disclosure relates to a semiconductor device, and more particularly, to an active cell isolation body of a semiconductor device and a method for forming the same.

BACKGROUND

Recently, processing technologies of the semiconductor devices are developed rapidly, active cell isolation technologies for isolating active cells become one kind of very important technologies in view of micronizing (i.e., reducing the size or the design rule of) the semiconductor device.

In general, of the known semiconductor device active cell isolation technologies, LOCOS (local oxidation of silicon) has been the major technology, in which a thick oxide film is grown selectively on a substrate to form a series of active cell isolation bodies.

However, LOCOS has a disadvantage in that a width of the active cell isolation region can not be reduced below a certain level due to lateral diffusion of the active cell isolation film and the known bird's beak phenomenon. More recently, some new technologies for overcoming the disadvantage of the LOCOS technology such as "a trench technology", "an STI (Shallow Trench Isolation) technology", "an air gap STI technology", etc., have been developed and used widely.

Referring to FIG. 1A, in the known STI technology, for an example, the air gap STI technology, the active cell isolation body is formed by using a sacrificial oxide film 11 and a sacrificial nitride film 12 on a semiconductor substrate 1 and patterning the sacrificial oxide film 11 and the sacrificial nitride film 12 with a photoresist pattern 13, forming a trench 2 in an active cell isolation region FR of the semiconductor substrate 1 by using the patterned sacrificial oxide film 11 and the sacrificial nitride film 12 as mask, and growing an oxide film 3 on an etched surface of the trench 2, filling a filler material in the trench 2, and forming a cap layer 5 on the semiconductor substrate 1 inclusive of the filler material 4 as shown in FIG. 1B, evaporating the filler material 4 from the trench 2, to form a series of gaps 'g' in the trench 2, and depositing a thick insulating layer 6a on the cap layer 5 inclusive of the trench 2 as shown in FIG. 1C, planarizing the insulating layer 6a to form an active cell isolation film 6 on the trench 2 as shown in FIG. 1D, and removing the sacrificial oxide film 11 and the sacrificial nitride film 12 as shown in FIG. 1E. The active cell isolation body 7 formed in this manner serves to insulate active cells securely when a series of the active cells are subsequently fabricated on the active region AR.

In the known STI technology, a scale of the trench 2 is an important factor in determining a quality of the semiconductor device. This is because, if the trench 2 is a too small scale, which weakens a device isolating function of the active cell isolation body 7 significantly, there can be a serious problem of unnecessary interferences caused between the active cells on the active regions AR of the semiconductor substrate 1. However, even if the reduction of the scale of the trench 2 affects the device isolating function seriously, the scale of the trench 2 can not be increased without a plan. This is because if the scale of the trench 2 is enlarged too much, an effective scale of the active region AR can be reduced significantly due to an influence of the enlargement, resulting in a serious difficulty during subsequent fabrication of the active cells.

Even if it is known that the reduction of scale of the trench 2 affects significantly the active cell isolation function, an actual counter measure for the reduction of the effective scale down of the active region AR has not been provided.

Of course, if the scale of the trench 2 is reduced and no measure is taken, the active cells formed on the active region AR contribute to the unnecessary degradation of performance due to failure of an insulating function of the active cell isolation body 7. In the meantime, as described before, with the known STI technology for forming the air gap 'g', it is required to fill the trench 2 with the filler material 4 and evaporate the filler material 4. However, because the filler material 4, which may be amorphous carbon, silica gel, silic acid polybutadiene, and so on, are expensive and can be difficult to work with because these materials are required to be vaporized at a temperature lower than surrounding oxide films, as far as use of the filler material 4 is not excluded perfectly, which increases a total cost for fabricating the semiconductor.

DETAILED DESCRIPTION

Figure 1A:
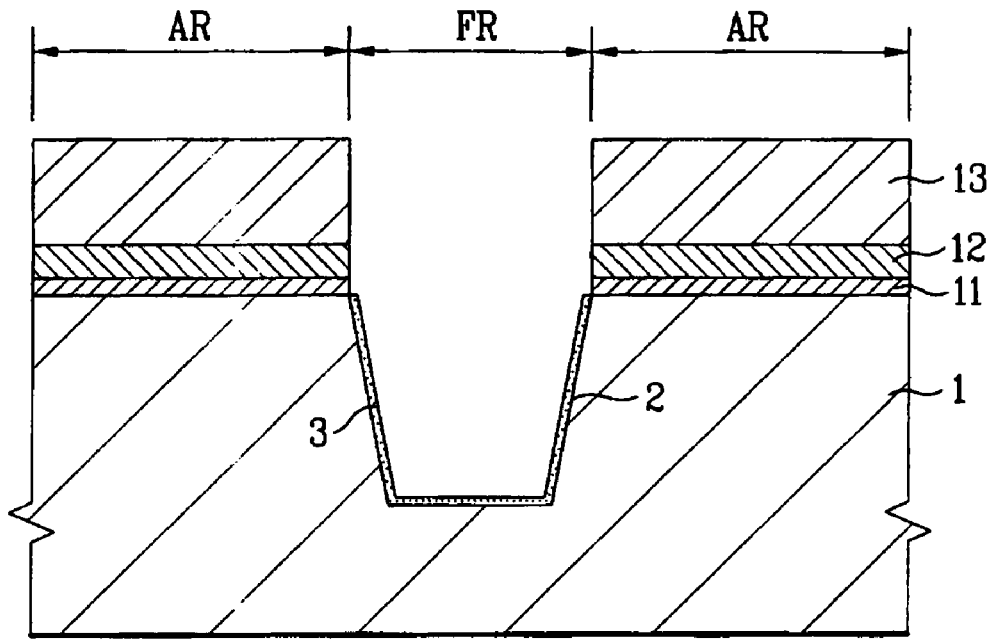
FIGS. 1A~1E illustrate sections that depict a known method of forming an active cell isolation body of a semiconductor device.
Figure 1B:
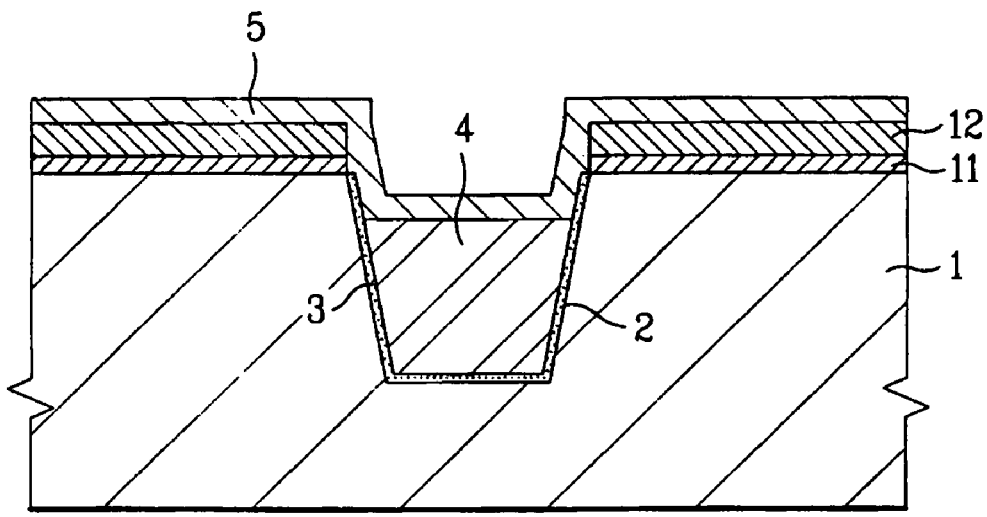
Figure 1C:
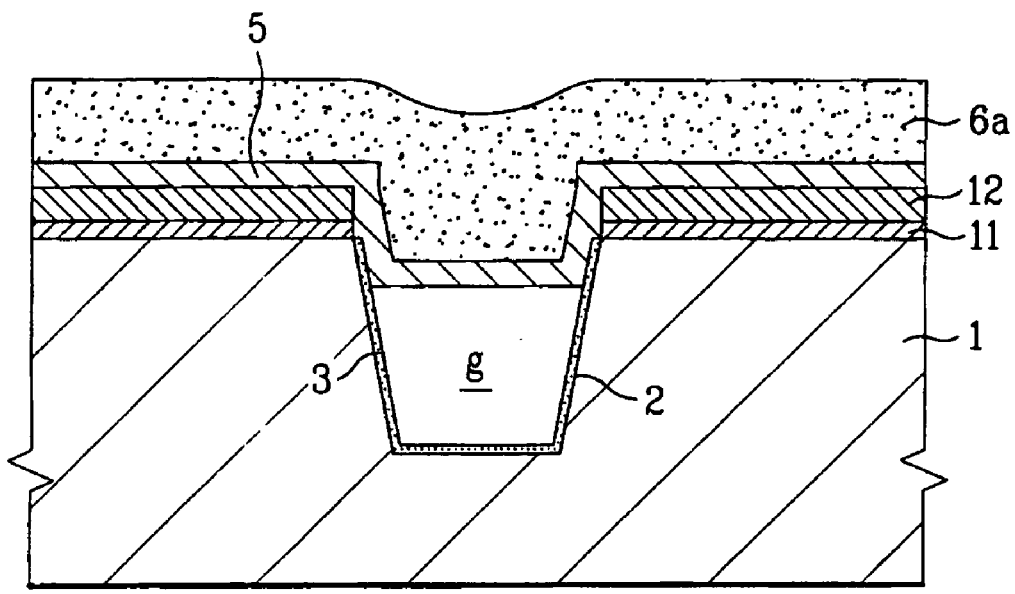
Figure 1D:
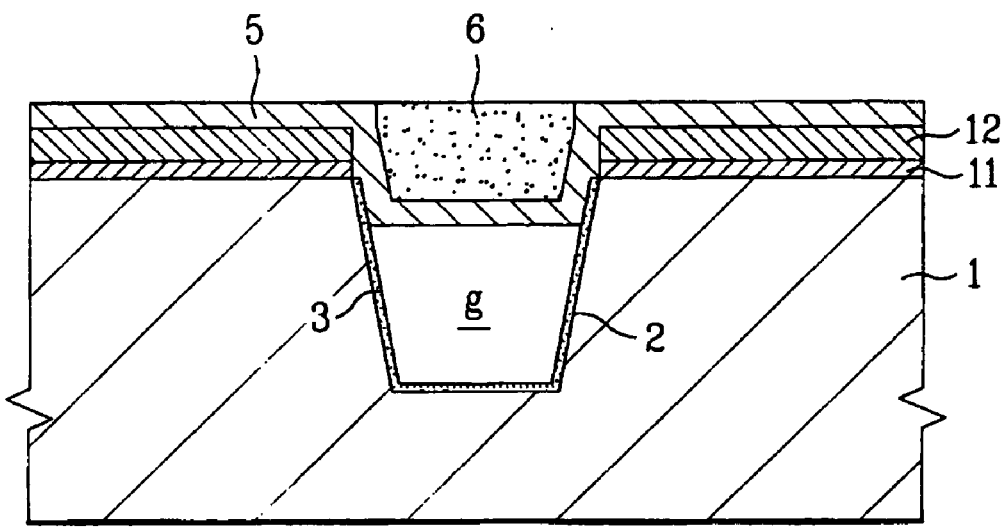
Figure 1E:
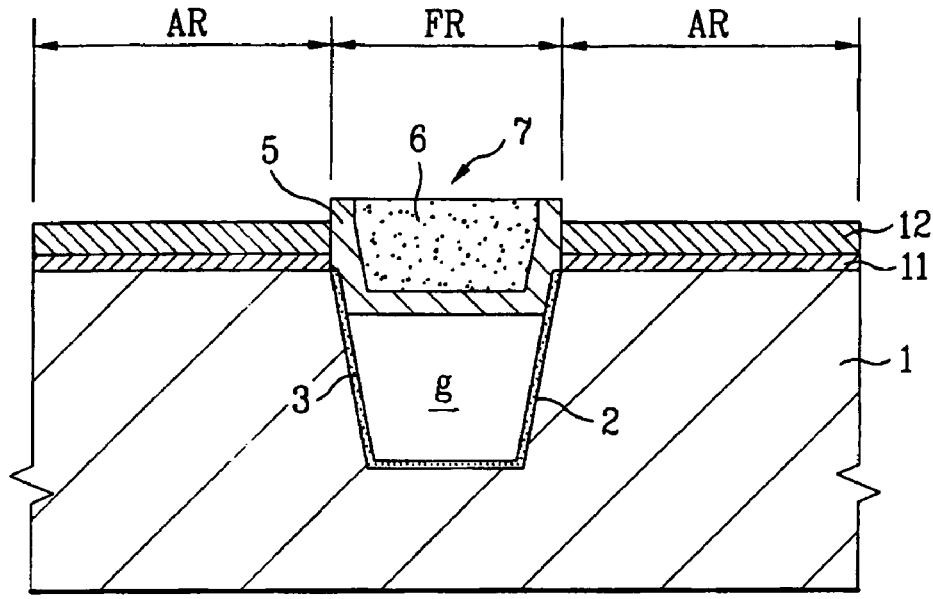

In general, the example methods and apparatus described herein provide an active cell isolation body of a semiconductor device and a method for forming the same. In one example, a buried gap or a buried insulating layer is formed in a semiconductor substrate at a lower portion of an active cell isolation region extended in a lateral direction in communication with a trench so that the active cell isolation body completed finally based on the buried gap or the buried insulating layer can be made to maintain its insulating performance in an optimum state while the active cell isolation body encroaches no effective active region unnecessarily.

In the example methods and apparatus described herein an insulating performance of the active cell isolation body is enhanced higher than a certain level by forming the buried gap or the buried insulating film so that even if leakage currents between active cells increase significantly due to operation speeds of the active cells becoming faster, the active cell isolation body can respond to it flexibly.

Further, the example methods and apparatus described herein provide an active cell isolation body of a semiconductor device, and a method for forming the same, in which an insulating performance of the active cell isolation body is enhanced to minimize leakage currents between active cells to prevent the active cells from being involved in performance degradation.

Still further, the example methods and apparatus described herein provide a an active cell isolation body of a semiconductor device and a method for forming the same in which a buried oxide film is formed in the semiconductor substrate at a lower portion of an active cell isolation region by ion injection and the buried oxide film is removed to define an empty space in the semiconductor substrate at the lower portion of the active cell isolation region smoothly so that the active cell isolation body is enabled to have an air gap without using the expensive filler material, which reduces the overall cost for fabricating a semiconductor device.

In one example, an active cell isolation body of a semiconductor device includes a trench with a depth in a semiconductor substrate at an active cell isolation region, a buried gap in the semiconductor substrate at a lower portion of the active cell isolation region, the buried gap being in communication with the trench, and extended toward active regions of the semiconductor substrate, and an active cell isolation film filled in the trench to close the buried gap.

In another example, a method for forming an active cell isolation body of a semiconductor device includes injecting ions into a semiconductor substrate targeting at an active cell isolation region selectively, diffusing the ions to form a buried insulating layer in the semiconductor substrate at a lower portion of the active cell isolation region extended toward active regions of the semiconductor substrate, etching the semiconductor substrate at the active cell isolation region to form a trench in contact with the buried insulating layer, etching the buried insulating layer to form a buried gap in communication with the trench, and selectively filling the trench with an active cell isolation film to close the buried gap.

Figure 2:
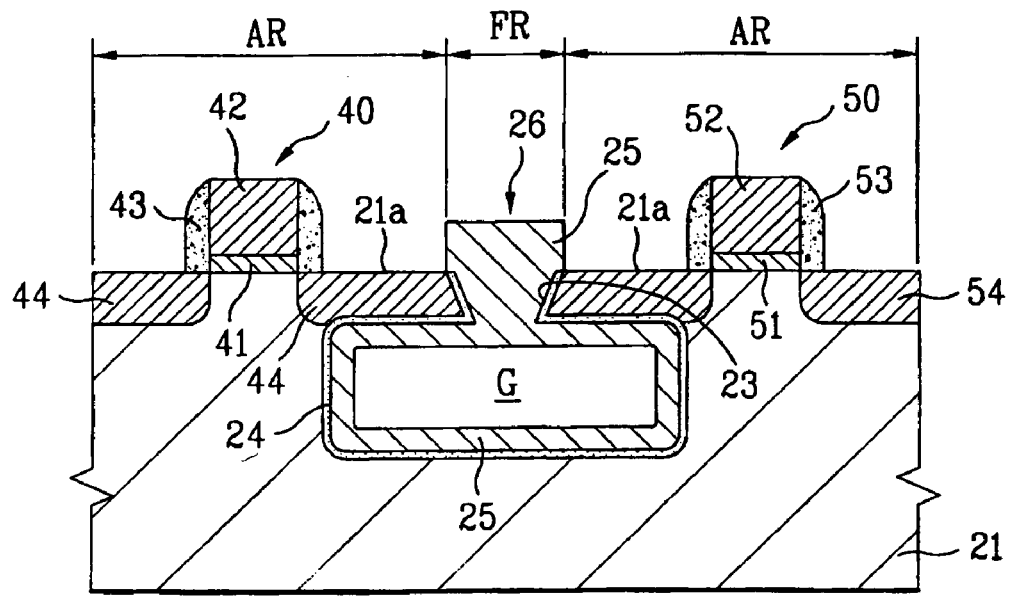
FIG. 2 illustrates a section of an exemplary semiconductor device having an active cell isolation body made in accordance with an example embodiment.

Referring to FIG. 2, in an example semiconductor device, there is an active cell isolation body 26 that sections and defines a semiconductor substrate 21 as an active cell isolation region FR, and an active region AR. At the active region AR of the semiconductor substrate 21, there is an active cell such as, for an example, a transistor 40 or 50, for selective switching of a charge flow, wherein the transistor 40 or 50 includes, for example, a gate insulating film pattern 41 or 51, a gate electrode pattern 42 or 52, spacers 43 or 53, source/drain diffusion layers 44 or 54, and so on.

Though not shown, the active cell isolation body 26 at the active cell isolation region FR of the semiconductor substrate 21 includes a trench 23 etched into the semiconductor substrate 21 by a depth, a buried gap 'G' buried in the semiconductor substrate 21 at a lower portion of the active cell isolation region FR so as to be in communication with the trench 23 and extended to the active regions AR of the semiconductor substrate 21, a substrate reinforcing oxide film 24 on surfaces of the trench 23 and the buried gap 'G', and an active cell isolation film 25 closely filled in the trench 23 to close the buried gap 'G' for performing an active cell isolation function. That is, the active cell isolation body 26 can enhance the active cell isolation function owing to the buried gap 'G' extended to the active regions AR of the semiconductor substrate 21.

Of course, in this case, because the buried gap 'G' is buried in the semiconductor substrate 21 regardless of a surface 21a of the active region AR, the active region AR of the semiconductor substrate 21 can maintain its regular effective scale even if the active cell isolation function of the active cell isolation body 26 is enhanced by the additional buried gap 'G'.

In contrast to the example methods and apparatus disclosed herein, with known methods and apparatus, if the scale of the trench is enlarged too much, fabrication of the active cell becomes difficult due to substantial reduction of an effective scale of the active region even though the active cell isolation function of the active region can be enhanced and even if it is known that the reduction of scale of the trench affects the active cell isolation function very much, an actual counter measure for this is provided.

However, with the example methods and apparatus described herein, because there is the buried gap 'G' buried under the active cell isolation region FR in communication with the trench 23 extended in a lateral direction of the semiconductor substrate 21 regardless of the surface 21a of the active region AR, the active cell isolation body 26 can maintain its insulating function in an optimum state even if the active cell isolation body 26 encroaches no effective active region AR of the semiconductor substrate 21 unnecessarily, such that, in an environment in which the examples described herein are implemented, the transistor 40 or 50 at the active region AR can avoid unnecessary performance degradation easily even if leakage current increases significantly due to fast speed operation of the transistor to improve a quality of the semiconductor device.

Figure 3A:
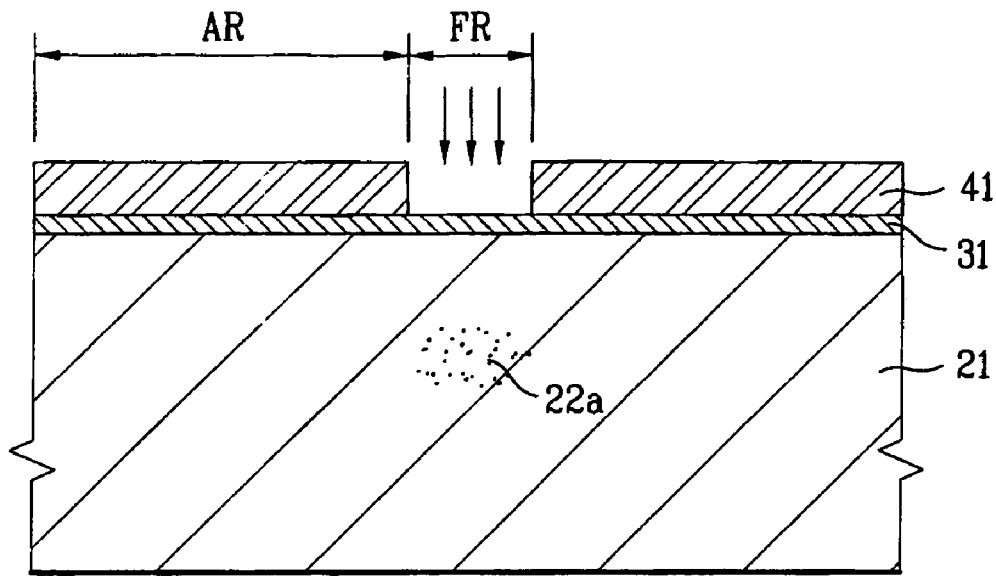
FIGS. 3A~3I illustrate sections that depict an example method of forming an active cell isolation body.
Figure 3B:
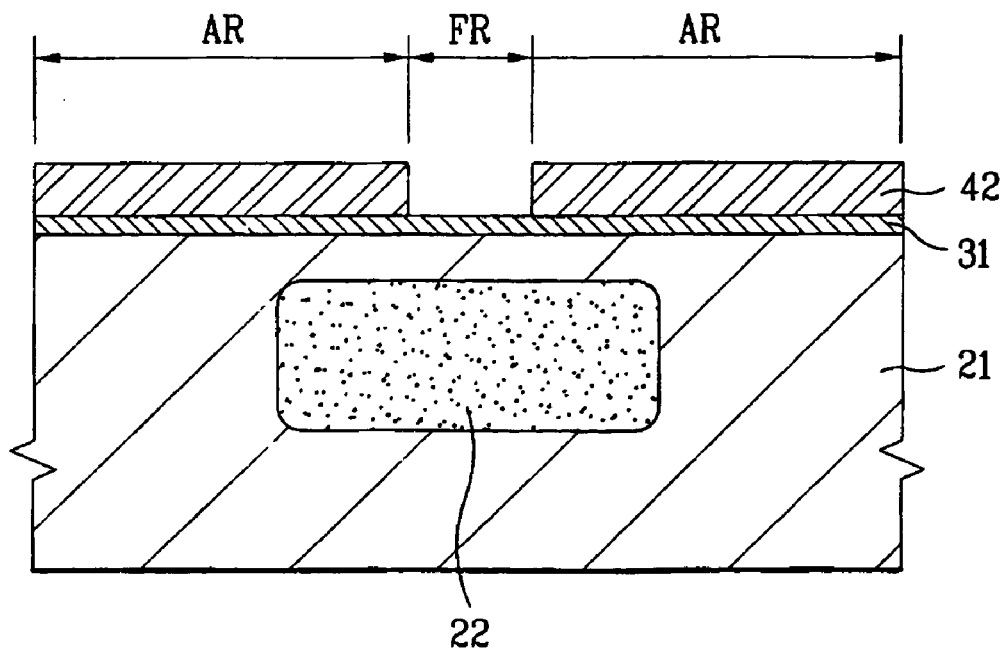

Referring to FIG. 3A, high temperature thermal oxidation is performed to grow a sacrificial oxide film 31 on an entire surface of a semiconductor substrate 21, which may be as single crystal silicon or the like, to a thickness in a range of 40 Å~150 Å. The sacrificial oxide film 31 moderates stress on the semiconductor substrate 21 in the operations set forth below.

A photoresist film pattern 41 is formed on the sacrificial oxide film 31 so that an opening of the photoresist film is in an active cell isolation region FR of the semiconductor substrate 21 and ions are injected targeting at the active cell isolation region FR of the semiconductor substrate 21 opened by the photoresist film pattern 41 to embed ions 22a, preferably oxygen ions, in the semiconductor substrate 21 at a lower portion of the active cell isolation region FR, preferably at a concentration of $10^{12}$ atoms/cm$^2$~$10^{18}$ atoms/cm$^2$.

Then, heat treatment is performed, preferably in a range of 1000° C.~2000° C. to diffuse the ions so that a buried insulating layer 22, for an example, a buried oxide layer, is formed, which is in the semiconductor substrate 21 at the lower portion of the active cell isolation region FR extended toward the active regions AR of the semiconductor substrate 21. The buried insulating layer 22 is at 3000 Å~8000 Å under a surface of the semiconductor substrate 21. Then, low pressure chemical vapor deposition is performed, to form a sacrificial nitride film 32 on the sacrificial oxide film 31 to a thickness in a range of 600 Å~1500 Å. The sacrificial nitride film 32 serves as a mask layer in formation of a trench 23 later, as well as an etch stop film in chemical mechanical polishing.

A photoresist film pattern 42 is formed on the sacrificial nitride film 32 so that an opening of the photoresist film is formed at the active cell isolation region FR of the semiconductor substrate 21, and dry etching having an anisotropic characteristic, for an example, a reactive ion etching process, is performed by using the photoresist pattern 42 as an etch mask to pattern the sacrificial oxide film 31 and the sacrificial nitride film 32 until a surface of the active cell isolation region of the semiconductor substrate 1 is exposed. Then, the photoresist film pattern 42 is removed.

Figure 3C:
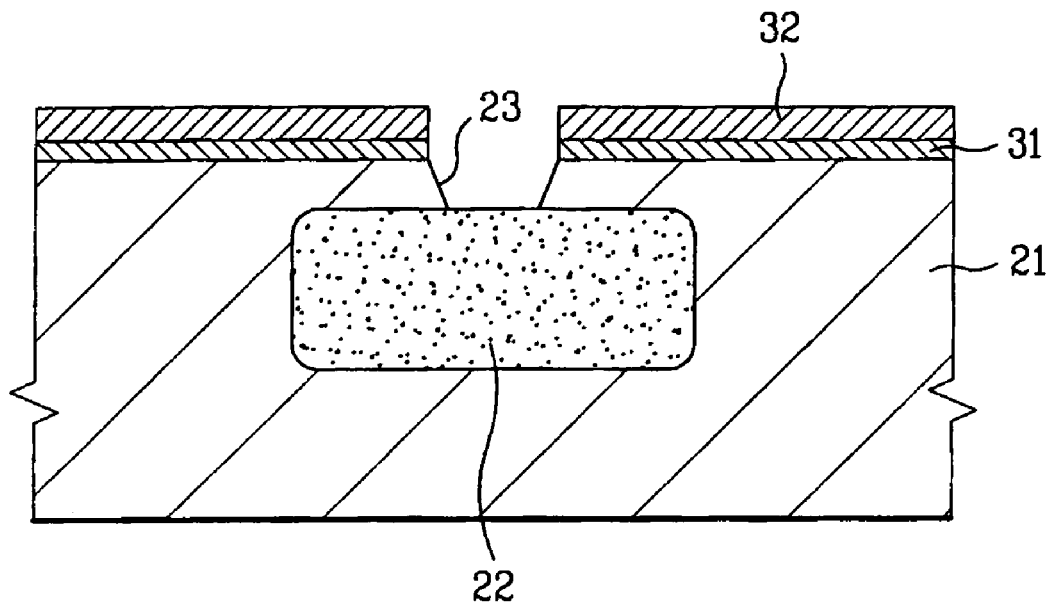
Figure 3D:
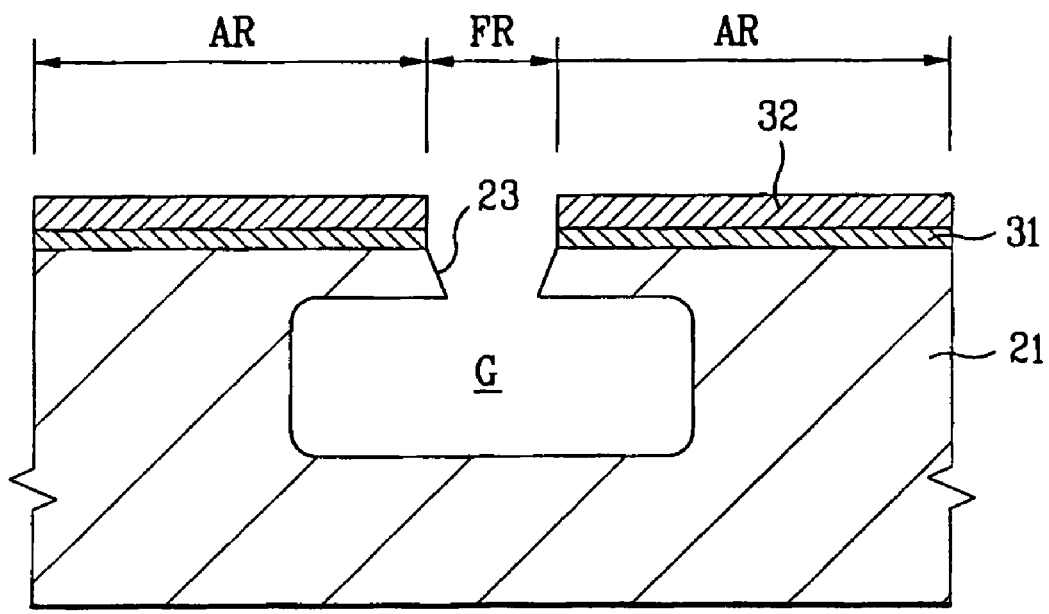

Then, referring to FIG. 3C, for an example, reactive ion etching is performed by using remaining portions of the sacrificial nitride film 32 and the sacrificial oxide film 31 as an etch mask to anisotropically etch an exposed portion of the semiconductor substrate 21 at the active cell isolation region FR to form a trench 23 in contact with the buried insulating layer 22. For an example, etching can be performed by using an HF solution to totally remove the buried insulating layer 22 to fully empty a space occupied by the buried insulating layer 22 to form a buried gap 'G' in the semiconductor substrate 21 at the lower portion of the active cell isolation region FR extended toward the active regions AR of the semiconductor substrate 21 as shown in FIG. 3D. Of course, because such a buried gap 'G' replaces the buried insulating layer 22, alike the buried insulating layer 22, the buried gap 'G' is also at 3000 Å~8000 Å under a surface of the semiconductor substrate 21.

With known methods and apparatus, because it is required to form the air gap to fill the trench with an expensive filler material, and vaporize the filler material, as far as use of the filler material is not excluded perfectly, the total cost of fabricating the semiconductor device is relatively high. However, in contrast to such known methods and apparatus, the example methods and apparatus described herein use a buried oxide film 22 that is formed in the semiconductor substrate at the active cell isolation region FR by ion injection, and the buried oxide film 22 is removed to define an empty space (air gap, or buried gap) in the semiconductor substrate at the lower portion of the active cell isolation region FR smoothly. As a result, with the example methods and apparatus described herein, the active cell isolation body 26 provides a buried gap (air gap) without using the expensive filler material, thereby reducing the overall cost of fabricating a semiconductor device.

Figure 3E:
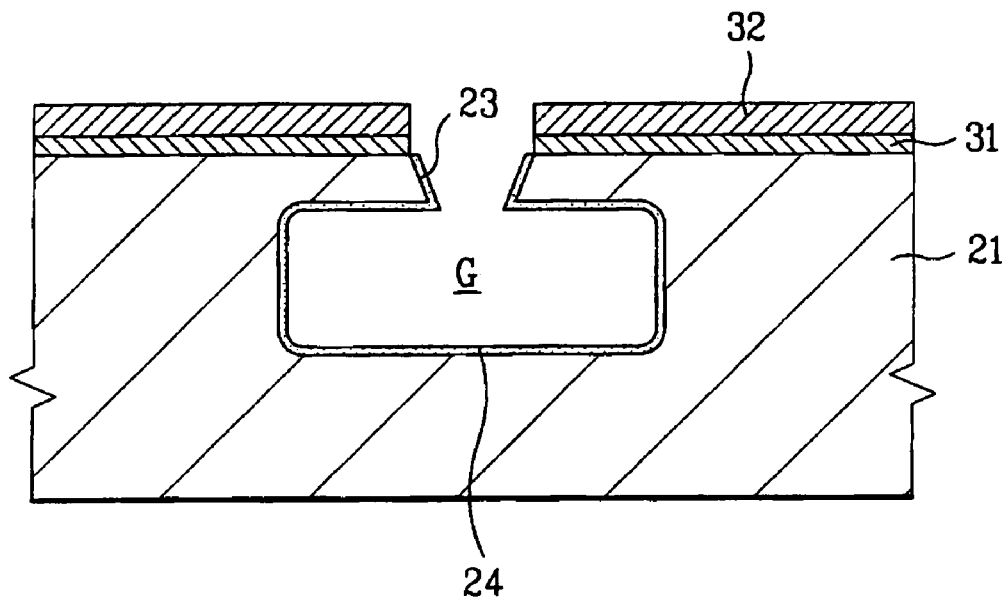

Upon completion of formation of the buried gap 'G' according to the above operations, heat treatment is performed in a range of 800° C.~900° C. to grow a substrate reinforcing oxide film 24 on surfaces of the trench 23 and the buried gap 'G' to a thickness in a range of 100 Å~400 Å as shown in FIG. 3E. In this instance, the substrate reinforcing oxide film 24 serves to guide an insulating film to be formed later to be adhered to etch surfaces of the trench 23 and the buried gap 'G', as well as cure damaged silicon lattice at the etched surfaces of the trench 23 and the buried gap 'G'.

Figure 3F:
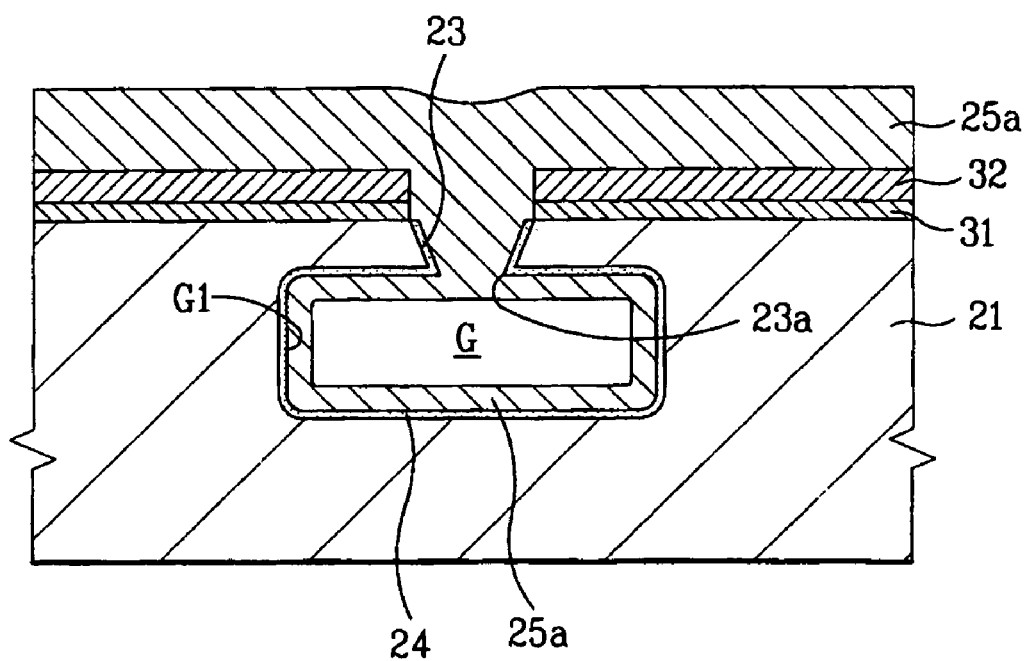
Figure 3G:
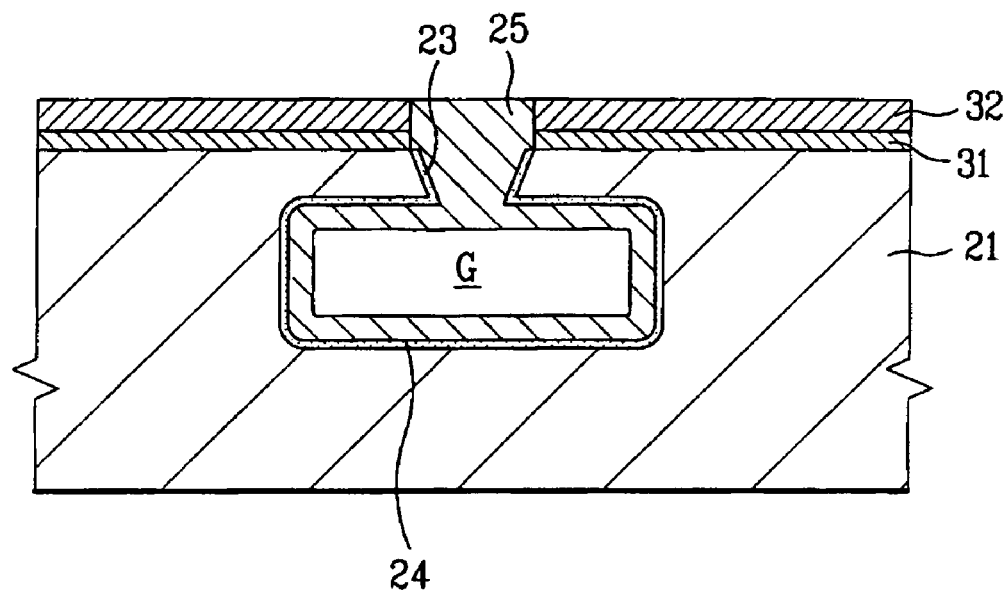

Depending on circumstance, for example, an ozone-TEOS (Tetra Ortho Silicate Glass process, an atmospheric chemical vapor deposition process, a plasma chemical vapor deposition process, and a high density plasma chemical vapor deposition process (HDP CVD) process, and so on are performed selectively, to fill the trench 23 with an adequate thickness of insulating film 25a, for an example, an oxide film, to cover the sacrificial nitride film 32 as shown in FIG. 3F. Of course, during formation of the insulating film 25a as shown in the drawing, alike on an inside of the trench 23, the insulating film 25a is grown on the etch surface 'G1' of the buried gap 'G' by gas flow at an initial stage. However, when the small opening 23a (entrance into the buried gap) of the trench 23 is blocked soon by rapid growth of the insulating film 25a, to cut off gas flow into the inside of the buried gap 'G' naturally, the insulating film 25a fails to fill the inside of the buried gap 'G' fully, but stops growth thereof so that the buried gap 'G' can maintain an empty space state regularly without problem even in a situation the insulating film 25a is filled in the trench 23.

Then, a chemical mechanical polishing process is performed by using the sacrificial nitride film 32 as an etch stop film to planarize the insulating film 25a up to a position at which the sacrificial nitride film 32 is formed to form an active cell isolation film 25, which fills the trench 23 fully to close the buried gap 'G' to perform an active cell isolation function.

Figure 3H:
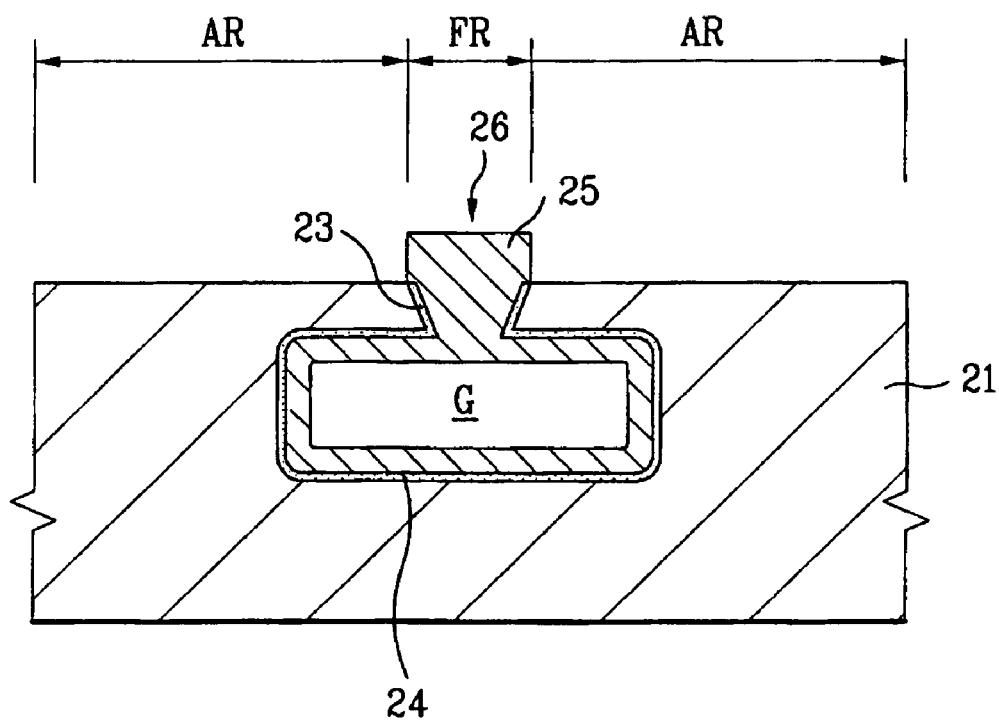

A wet etching process is performed by using, for an example, phosphoric acid solution, to isotropically etch the sacrificial nitride film 32 and a wet etching process is performed by using, for example, a fluoric acid solution to isotropically etch the sacrificial oxide film 31 until the active region AR of the semiconductor substrate 31 is exposed as shown in FIG. 3H, thereby completing formation of the active cell isolation body 26 including the trench 23 with a depth in the semiconductor substrate 21 at the active cell isolation region FR, a buried gap 'G' in the semiconductor device at the lower portion of the active cell isolation region FR in communication with the trench 23 extended toward the active regions AR of the semiconductor substrate 21, and an active cell isolation film 25 filled in the trench 23 to close the buried gap 'G', for performing an active cell isolation function. Although only one active cell isolation body 26 is depicted in the figure as being formed in the semiconductor substrate 21, there could alternatively be a plurality of active cell isolation bodies 26 for embodying a semiconductor device.

Figure 3I:
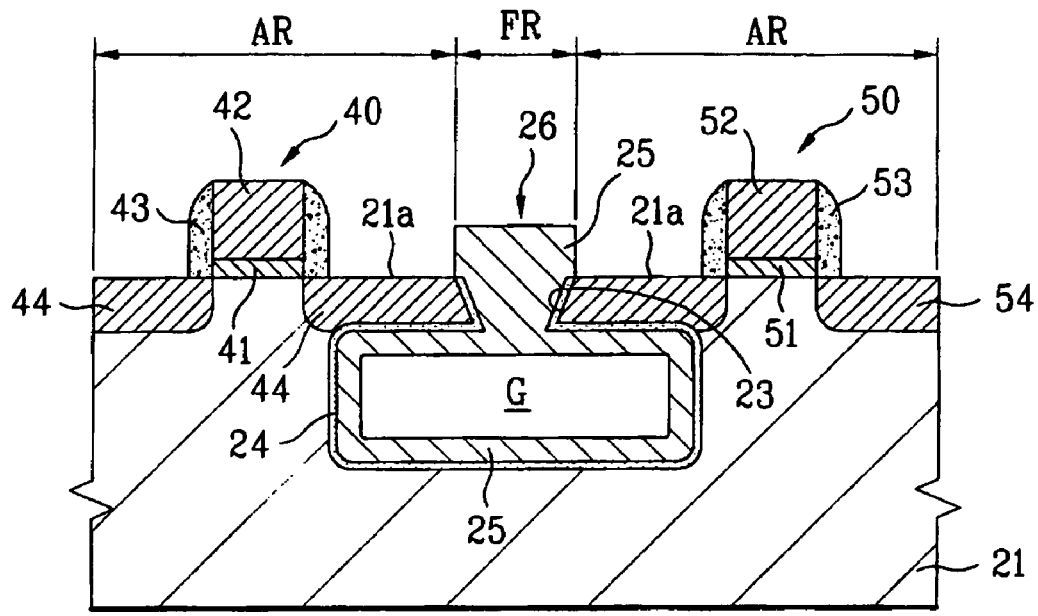

Referring to FIG. 3I, upon completion of formation of the active cell isolation body 26 that defines active regions AR of the semiconductor substrate 21, a thermal oxidation process is performed to grow a gate insulating film on the semiconductor substrate 21 at the active region AR, a chemical vapor deposition process is performed to form a gate electrode conduction layer on the gate insulating film in succession, and a photoetching process is performed to pattern the gate insulating film and the gate electrode conduction layer at a time to form a gate insulating film pattern 41 or 51, and a gate electrode pattern 42 or 52 on the semiconductor substrate 31 at the active region AR defined by the active cell isolation body 26. Although the drawing depicts the formation of only two gate patterns 42 and 52 on the semiconductor substrate 31, a plurality of gate electrode patterns could alternatively be formed in the semiconductor device.

Then, a series of chemical vapor deposition processes are performed to form an oxide film and a nitride film on the semiconductor substrate 21 inclusive of the gate electrode patterns 42 and 52 in succession, and a dry etching process having an anisotropic characteristic, such as reactive ion etching process, is performed to etch the oxide film and the nitride film to form spacers 43 and 53 on opposite sidewalls of the gate electrode patterns 42 and 52.

Next, an ion injection process is performed by using the spacers 43 and 53 as an ion injection mask to inject impurities into the semiconductor substrate 21 at the active region to form source/drain diffusion layers 44 and 54 on opposite sides of the gate electrode patterns 42 and 52. Because the active cell isolation body 26 has the buried gap 'G' extended in a lateral direction of the semiconductor substrate 21 so that the active cell isolation body 26 is also in communication with the trench 23 to maintain its insulating function in an optimum state. Thus, in this manner, the transistor 40 or 50 at the active region AR can avoid unnecessary performance degradation caused by interference from each other easily even if leakage current from each other increases significantly due to fast speed operation of the transistor.

Figure 4:
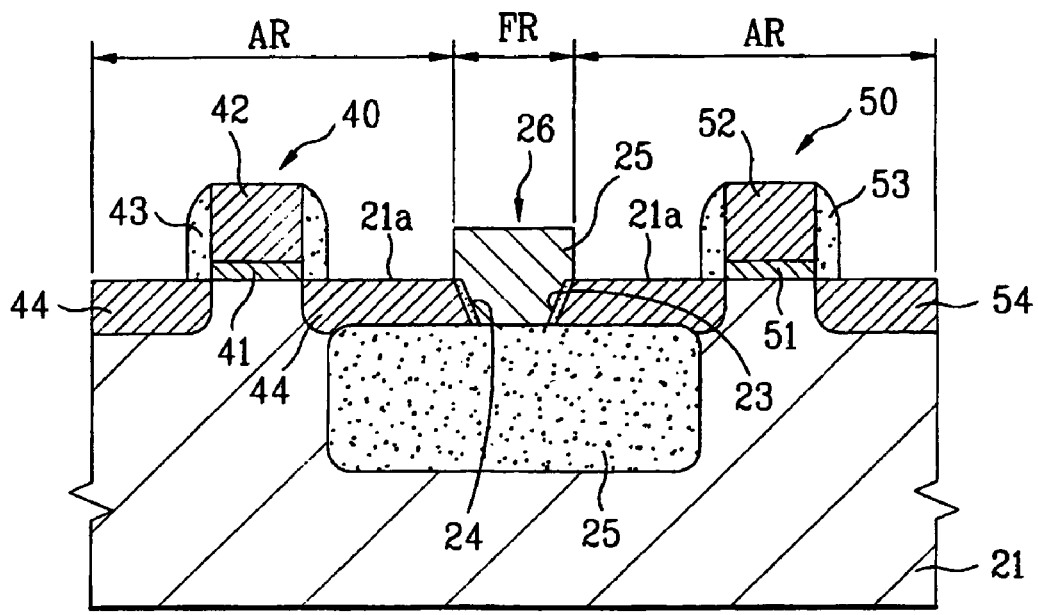
FIG. 4 illustrates a section of another example semiconductor device having an active cell isolation body.
Figure 5A:
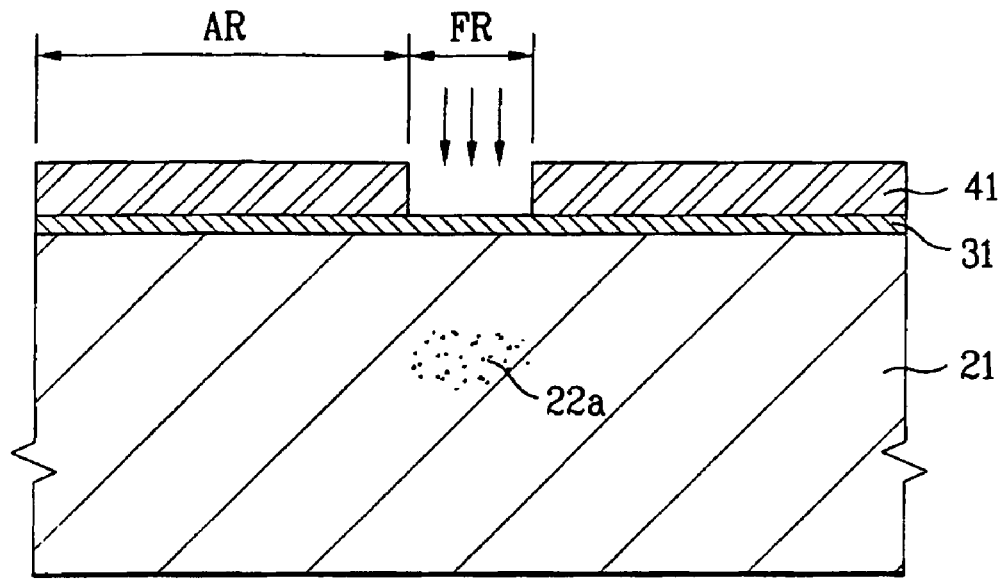
FIGS. 5A~5F illustrate sections depicting an example method of forming an active cell isolation body.
Figure 5B:
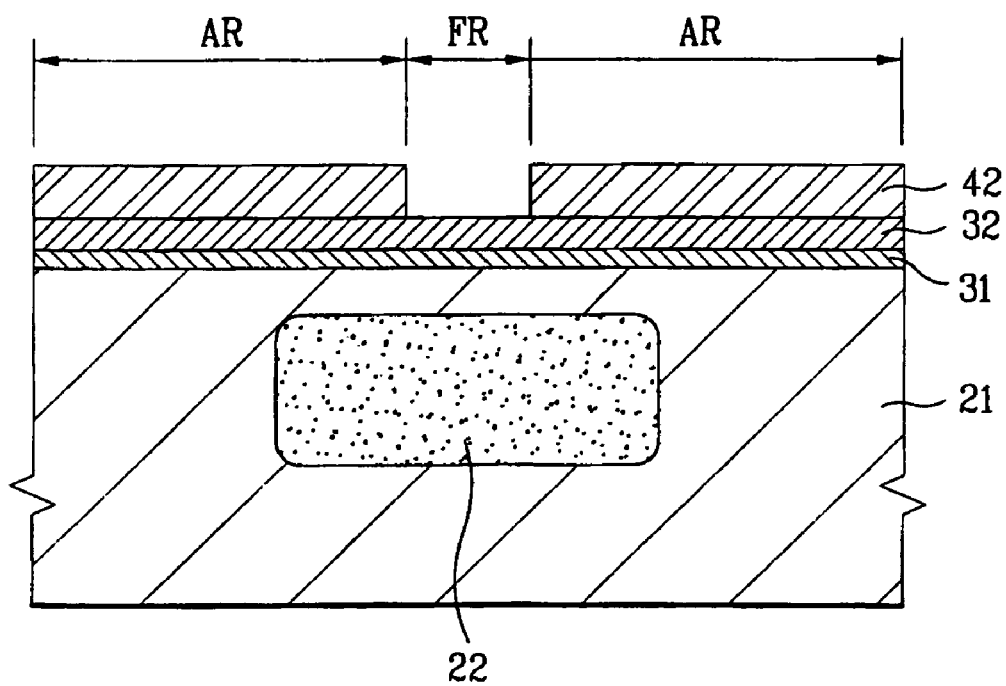
Figure 5C:
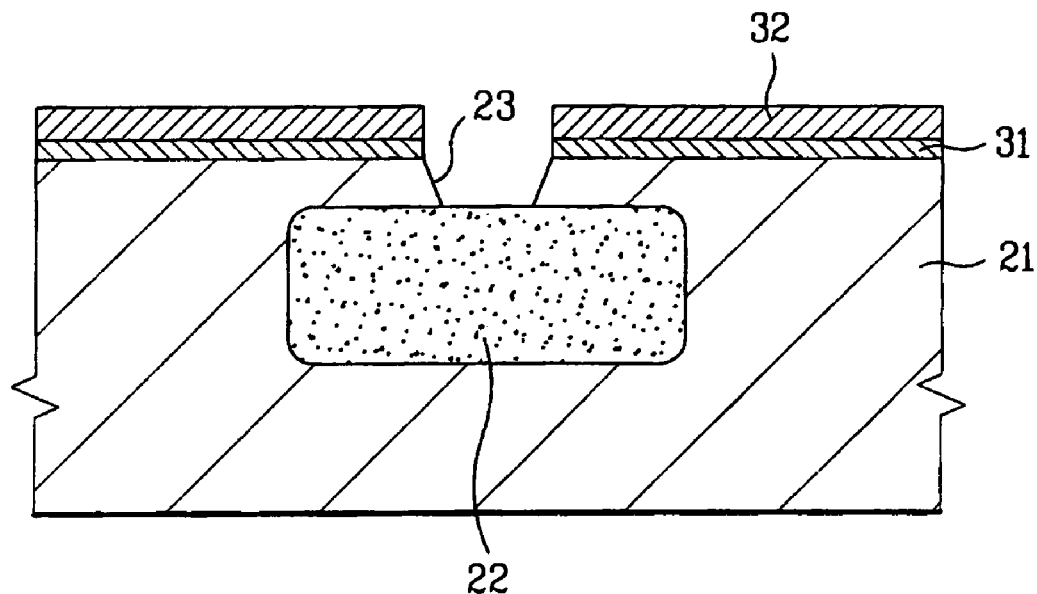
Figure 5D:
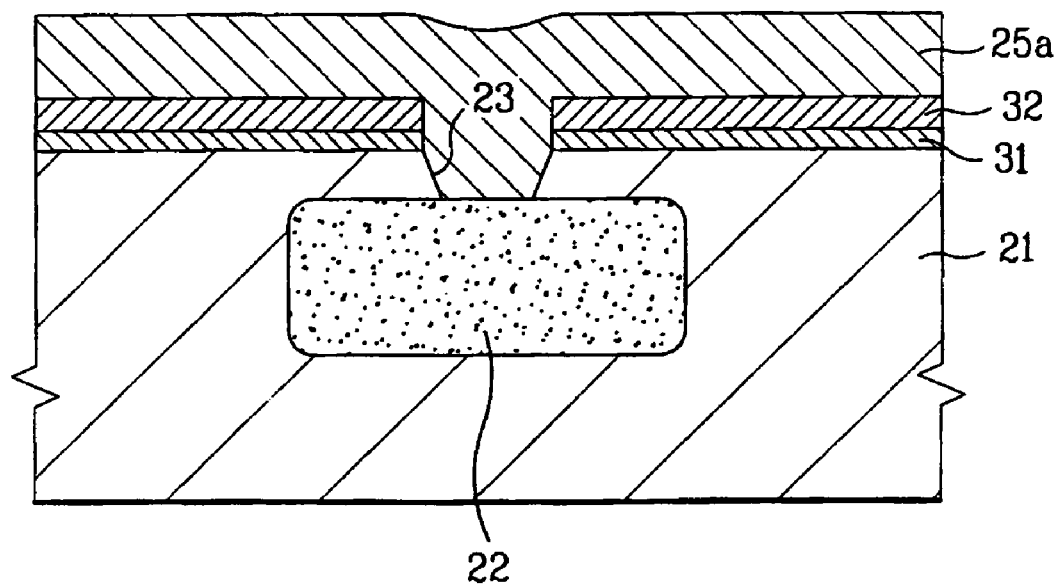
Figure 5E:
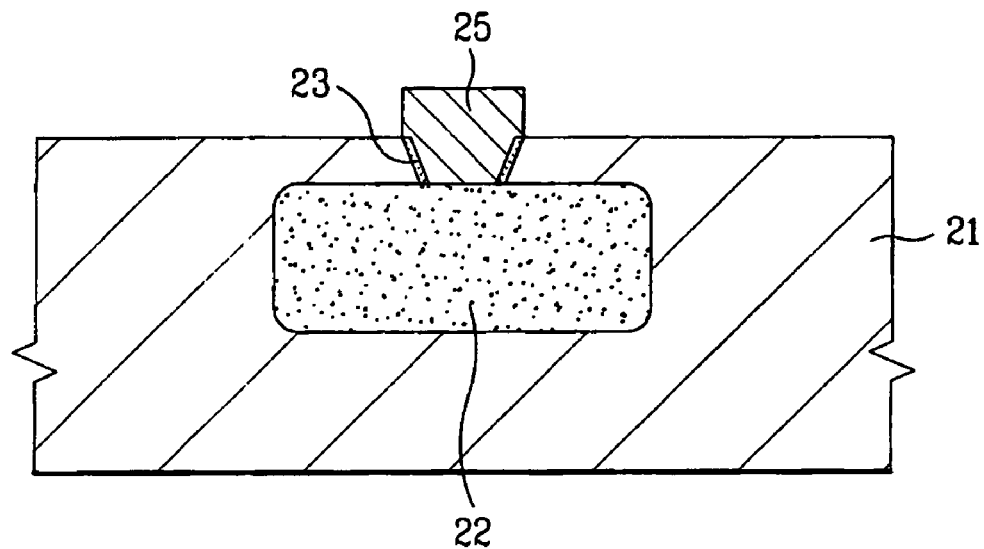
Figure 5F:
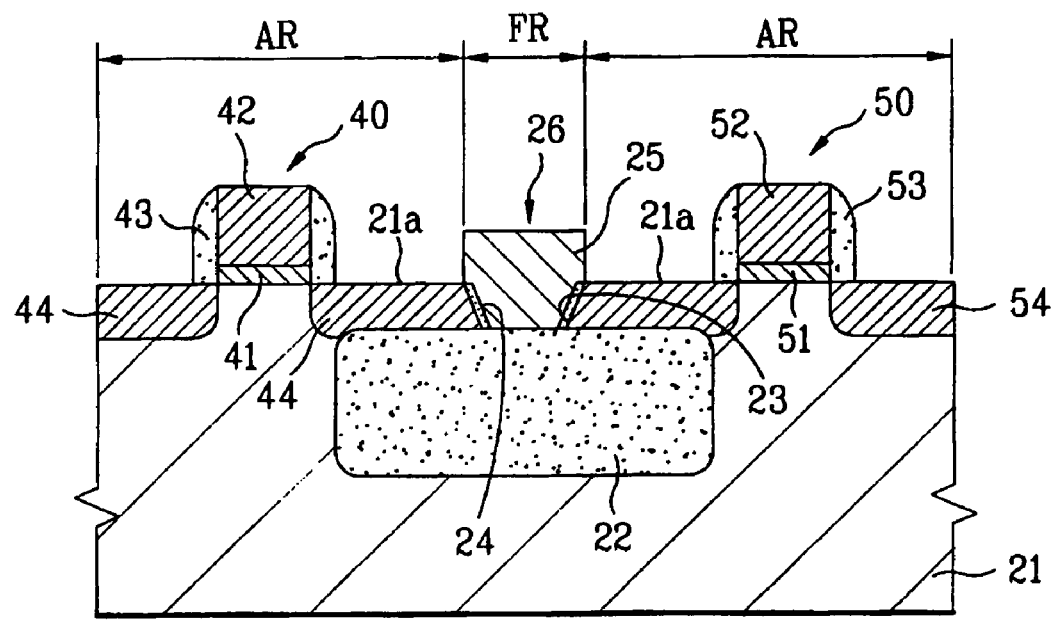

Depending on the particular implementation or desired application, methods and apparatus described herein can have many variations. For an example, as shown in FIG. 4, the active cell isolation body 26 may include a trench 23 with a depth in the semiconductor substrate 21 at the active cell isolation region FR, a buried insulating film 22 in the semiconductor device at a lower portion of the active cell isolation region FR in contact with the trench 23 extended toward the active regions AR, and an active cell isolation film 25 filled in the trench 23 selectively to close the buried insulating film 22. In this instance, a operation for performing an etching process by using an HF solution to entirely remove the buried insulating layer 22 to empty a space the buried insulating layer 22 occupies fully, i.e., an operation for forming the buried gap 'G' can be excluded.

Of course, in a case where an operation forming the buried gap 'G' is excluded, because the buried insulating layer 22, which has an insulating performance lower than the buried gap 'G' is replaced as a major element of the active cell isolation body 26, to drop the active cell isolation performance of the active cell isolation body 26 completed finally, because process operations can be simplified significantly in return, a whole process efficiency can be improved significantly.

Of course, in this case too, because the active cell isolation body 26 has the buried insulating layer 22 extended in a lateral direction of the semiconductor substrate 21 so that the buried insulating film 22 is also in communication with the trench 23, the active cell isolation body 26 can maintain its insulating function in an optimum state. As a result, the transistor 40 or 50 at the active region AR can avoid unnecessary performance degradation caused by interference from each other even if leakage current from each other increases significantly due to fast speed operation of the transistor.

Referring to FIGS. 5A~5F, the active cell isolation body 26 in accordance with another example embodiment can be formed by operations including selective injection of ions 22a into a semiconductor substrate 21 targeting at an active cell isolation region FR, diffusing the ions 22a to form a buried insulating layer 22 in the semiconductor substrate 21 at a lower portion of the active cell isolation region FR extended toward the active regions AR of the semiconductor substrate 21, etching the semiconductor substrate 21 at the active cell isolation region FR to form a trench 23 in contact with the buried insulating layer 22, growing a substrate reinforcing oxide film 24 on a surface of the trench 23, and selectively filling the trench 23 with an active cell isolation film 25 to close the buried insulating layer 22.

As has been described, by forming a buried gap or a buried insulating layer in a semiconductor substrate at a lower portion of an active cell isolation region extended in a lateral direction and in communication with a trench, an active cell isolation body completed finally based on the buried gap or the buried insulating layer can be made to maintain its insulating performance in an optimum state while the active cell isolation body encroaches no effective active region unnecessarily.

Thus, when the insulating performance of the active cell isolation body is enhanced higher than a certain level owing to the buried gap, or the buried insulating film, the transistor 40 or 50 at the active region AR can avoid unnecessary performance degradation caused by interference easily even if leakage current from each other increases significantly due to fast speed operation of the transistor.

By forming a buried oxide film in the semiconductor substrate at a lower portion of an active cell isolation region by ion injection and removing the buried oxide film to define an empty space in the semiconductor substrate at the lower portion of the active cell isolation region smoothly, the active cell isolation body 26 is enabled to have an air gap without using the expensive filler material, thereby reducing the overall cost for fabricating a semiconductor device.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for forming an active cell isolation body of a semiconductor device, comprising:
    injecting ions into a semiconductor substrate while selectively targeting an active cell isolation region;
    diffusing the ions to form a buried insulating layer in the semiconductor substrate at a lower portion of the active cell isolation region extended toward active regions of the semiconductor substrate;
    etching the semiconductor substrate at the active cell isolation region to form a trench in contact with the buried insulating layer;
    etching the buried insulating layer to form a buried gap in communication with the trench; and
    selectively filling the trench with an active cell isolation film to close the buried gap and maintain an empty space in the buried gap.

2. The method as claimed in claim 1, wherein the ion is an oxygen ion.

3. The method as claimed in claim 1, wherein the step of diffusing the ions includes performing a heat treatment process at 1000° C.~2000° C. to diffuse the ions.

4. The method as claimed in claim 1, wherein the ions are injected at a concentration of $10^{12}$ atoms/cm$^2$~$10^{18}$ atoms/cm$^2$.

5. The method as claimed in claim 1, further comprising growing a substrate reinforcing oxide film on etched surfaces of the trench and the buried gap.

6. A method for forming an active cell isolation body of a semiconductor device, comprising:
    injecting ions into a semiconductor substrate while selectively targeting an active cell isolation region;
    diffusing the ions to form a buried insulating layer in the semiconductor substrate at a lower portion of the active cell isolation region extended toward active regions of the semiconductor substrate;
    etching the semiconductor substrate at the active cell isolation region to form a trench in contact with the buried insulating layer, and
    selectively filling the trench with an active cell isolation film to close the buried insulating film.

7. The method as claimed in claim 6, wherein the ion is an oxygen ion.

8. The method as claimed in claim 6, wherein the step of diffusing the ions includes performing a heat treatment process at 1000° C.~2000° C. to diffuse the ions.

9. The method as claimed in claim 6, wherein the ions are injected at a concentration of $10^{12}$ atoms/cm$^2$~$10^{18}$ atoms/cm$^2$.

10. The method as claimed in claim 6, further comprising growing a substrate reinforcing oxide film on etched surfaces of the trench and the buried gap.

11. The method as claimed in claim 6, wherein the active cell isolation film contacts the buried insulating film.

* * * * *